(12) United States Patent
Fitzgerald et al.

(10) Patent No.: US 12,202,723 B2
(45) Date of Patent: Jan. 21, 2025

(54) MICROELECTROMECHANICAL SYSTEMS (MEMS) SWITCH AND RELATED METHODS

(71) Applicant: Analog Devices International Unlimited Company, Limerick (IE)

(72) Inventors: Padraig Fitzgerald, Mallow (IE); Michael James Twohig, Cork (IE); James Lee Lampen, Douglas, MA (US); Philip James Brennan, Bandon (IE)

(73) Assignee: Analog Devices International Unlimited Company, Limerick (IE)

( * ) Notice: Subject to any disclaimer, the term of this patent is extended or adjusted under 35 U.S.C. 154(b) by 350 days.

(21) Appl. No.: 17/746,058

(22) Filed: May 17, 2022

(65) Prior Publication Data
US 2022/0371882 A1 Nov. 24, 2022

Related U.S. Application Data

(60) Provisional application No. 63/190,209, filed on May 18, 2021.

(51) Int. Cl.
*B81B 7/00* (2006.01)

(52) U.S. Cl.
CPC ...... *B81B 7/0003* (2013.01); *B81B 2201/018* (2013.01); *B81B 2203/0307* (2013.01)

(58) Field of Classification Search
CPC ......... Y10S 438/937; H01L 2924/0002; H01L 41/1136; H01H 2057/006; H01H 59/0009; H01H 1/0036; H01H 57/00; B81C 2201/0109; B81C 2201/013; B81C 2201/0167; B81C 2201/017; B81C 2203/0136; B81C 2203/0172; B81C 2203/0015; B81C 2203/00365; B81C 2203/00476; B81C 2203/00619; B81C 2203/00626; B81C 2203/00666; B81B 2201/01; B81B 2201/014; B81B 2203/0118; B81B 2203/0315; B81B 2203/04; B81B 3/0072; B81B 3/0021; B81B 7/00; B81B 7/0003; B81B 2203/0307; B81B 2201/018; Y10T 29/42; Y10T 29/435; Y10T 29/49002; Y10T 29/49105; Y10T 29/49121;
(Continued)

(56) References Cited

U.S. PATENT DOCUMENTS

| | | | |
|---|---|---|---|
| 5,880,921 A | 3/1999 | Tham et al. | |
| 6,229,683 B1 | 5/2001 | Goodwin-Johansson | |

(Continued)

FOREIGN PATENT DOCUMENTS

| | | |
|---|---|---|
| CN | 110275286 A | 9/2019 |
| KR | 10 0522895 B1 | 10/2005 |

(Continued)

*Primary Examiner* — Anthony R Jimenez
(74) *Attorney, Agent, or Firm* — Wolf, Greenfield & Sacks, P.C.

(57) ABSTRACT

Microelectromechanical systems (MEMS) switches are disclosed. The MEMS switch may have an actuation voltage greater than the expected voltage of a signal being passed by the MEMS switch in normal operation. The MEMS switches may include a distributed hinge structure in some embodiments. Radial contact pads are included in some embodiments, with or separate from the distributed hinge.

20 Claims, 5 Drawing Sheets

(58) Field of Classification Search
CPC ........... Y10T 29/49126; Y10T 29/4913; Y10T 29/49155; Y10T 29/5313; G06F 17/5068; G06F 17/5072
USPC ........................................................ 200/514
See application file for complete search history.

(56) References Cited

U.S. PATENT DOCUMENTS

| | | | |
|---|---|---|---|
| 6,388,631 | B1 | 5/2002 | Livingston et al. |
| 6,686,820 | B1 | 2/2004 | Ma et al. |
| 7,119,943 | B2 | 10/2006 | Nelson et al. |
| 7,466,065 | B2 * | 12/2008 | Sanpei .................. H01H 61/00 310/330 |
| 7,821,466 | B2 | 10/2010 | Lempkowski |
| 7,864,006 | B2 | 1/2011 | Foster et al. |
| 8,079,262 | B2 | 12/2011 | Guo |
| 8,194,382 | B2 | 6/2012 | Ellis et al. |
| 8,203,880 | B2 | 6/2012 | Schepens et al. |
| 8,358,488 | B2 | 1/2013 | Premerlani et al. |
| 8,499,629 | B2 | 8/2013 | Ballas et al. |
| 8,861,218 | B2 | 10/2014 | Smith et al. |
| 8,978,475 | B2 | 3/2015 | Acar |
| 9,159,516 | B2 | 10/2015 | Hammond et al. |
| 9,221,677 | B2 | 12/2015 | Kim |
| 9,748,048 | B2 | 8/2017 | Fitzgerald et al. |
| 9,911,563 | B2 | 3/2018 | Macnamara et al. |
| 10,029,914 | B2 | 7/2018 | Huffman et al. |
| 10,141,495 | B1 | 11/2018 | Nordquist et al. |
| 10,388,468 | B2 | 8/2019 | Sampath et al. |
| 11,208,713 | B2 * | 12/2021 | Wang ........................ C23C 4/18 |
| 2002/0186449 | A1 | 12/2002 | Anderson et al. |
| 2009/0201119 | A1 | 8/2009 | Rubel |
| 2012/0080737 | A1 | 4/2012 | Zaitsu et al. |
| 2017/0225942 | A1 * | 8/2017 | Fitzgerald ............. B81B 3/0051 |
| 2019/0049482 | A1 | 2/2019 | Motiee |
| 2019/0371554 | A1 | 12/2019 | Khlat |
| 2020/0025792 | A1 | 1/2020 | Reinke |

FOREIGN PATENT DOCUMENTS

| | | |
|---|---|---|
| KR | 10 0678346 B1 | 2/2007 |
| WO | WO 2007/077353 A2 | 7/2007 |
| WO | WO 2007/078589 A1 | 7/2007 |
| WO | WO 2010/056435 A2 | 5/2010 |
| WO | WO 2012/088821 A1 | 7/2012 |
| WO | WO 2017/007428 A1 | 1/2017 |

* cited by examiner

MICROELECTROMECHANICAL SYSTEMS (MEMS) SWITCH AND RELATED METHODS

CROSS-REFERENCE TO RELATED APPLICATIONS

The present application claims the benefit under 35 U.S.C. § 119(e) of U.S. Provisional Patent Application Ser. No. 63/190,209, filed May 18, 2021, and entitled "MICROELECTROMECHANICAL SYSTEMS (MEMS) SWITCH AND RELATED METHODS," which is hereby incorporated herein by reference in its entirety.

FIELD OF THE DISCLOSURE

The present application relates to microelectromechanical system (MEMS) switches.

BACKGROUND

Some conventional MEMS switches include cantilevered beams. The switch is closed when the free end of the beam is pulled into contact with an underlying substrate by application of an electric field generated by applying a voltage to an electrode on the substrate. When no voltage is applied to the electrode on the substrate, and therefore no electric field is generated, the spring restoring force of the beam causes the free end of the beam to not contact the substrate, such that the switch is open. Often the MEMS switch opens and closes a connection to a circuit coupled to the MEMS switch.

BRIEF SUMMARY

Microelectromechanical systems (MEMS) switches are disclosed. The MEMS switch may have an actuation voltage greater than the expected voltage of a signal being passed by the MEMS switch in normal operation. Such a switch may be described as exhibiting a large actuation headroom. The MEMS switches may include a distributed hinge structure in some embodiments. Radial contact pads are included in some embodiments, used in combination with or separate from the distributed hinge.

According to an aspect of the present application, a microelectromechanical systems (MEMS) switch is provided, comprising: a substrate; an anchor coupled to the substrate; a beam coupled to the anchor by a plurality of hinges and suspended above the substrate; and a plurality of electrodes disposed on the substrate and including a first electrode configured to receive an actuation voltage and a second electrode configured to apply a signal to the beam, the actuation voltage being greater than a maximum voltage of the signal applied to the beam.

According to an aspect of the present application, a method of operating a microelectromechanical systems (MEMS) switch, comprising: applying an actuation voltage to a first electrode on a substrate underlying a beam of the MEMS switch; and applying a signal to the beam of the MEMS switch, wherein the actuation voltage is at least twice as large as a maximum voltage of the signal applied to the beam.

According to an aspect of the present application, a microelectromechanical systems (MEMS) teeter-totter switch, comprising: a substrate; an anchor; and a beam coupled to the anchor and configured to pivot about the anchor, wherein the anchor comprises four or more tethers attached to the beam.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

According to an aspect of the present application, a microelectromechanical systems (MEMS) switch is provided, having large actuation headroom. The actuation headroom is the voltage difference between the voltage needed to actuate the MEMS switch and the voltage of the signal passed by the MEMS switch. If the actuation voltage and the voltage of the signal passed by the MEMS switch are close to each other, then the MEMS switch may be inadvertently actuated by the signal it passes. MEMS switches according to aspects of the present application are configured to require an actuation voltage significantly greater than the expected voltage of the signal to be passed by the switch, and in at least some embodiments significantly greater than a maximum voltage of the signal to be passed by the switch. In this manner, inadvertent actuation of the switch may be avoided.

Aspects of the present application provide active microelectromechanical systems (MEMS) switches having a distributed hinge. The MEMS switch may include a relatively stiff beam connected to an underlying substrate by an anchor (e.g., a post) which may be centrally located with respect to the beam, and multiple hinges connecting the beam to the post. The hinges may be distributed in that they may include multiple hinges connecting the anchor to a same side of the beam instead of a single hinge connecting the anchor to that particular side of the beam. The distributed hinge may provide beneficial operation compared to a single hinge. According to some aspects of the present application, the beam may be constructed to substantially resist bending during operation of the MEMS switch, while the hinge(s) may be constructed to allow for rotation of the beam about the post. Not all embodiments are limited in this respect. For example, cantilever MEMS switches may include a beam configured to bend.

The aspects and embodiments described above, as well as additional aspects and embodiments, are described further below. These aspects and/or embodiments may be used individually, all together, or in any combination of two or more, as the application is not limited in this respect.

Figure 1A:
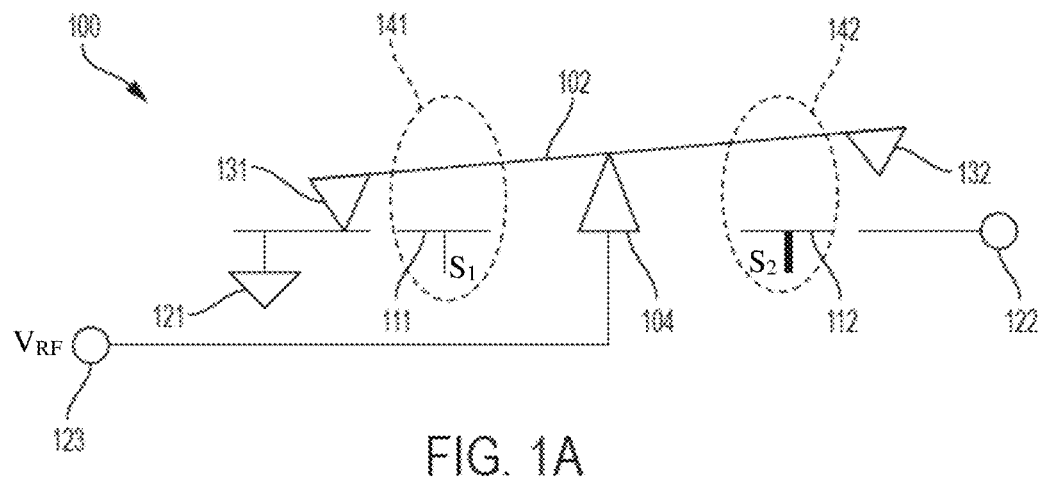
FIG. 1A illustrates schematically a MEMS teeter-totter switch in an open state, according to a non-limiting embodiment of the present application.

As described above, aspects of the present application provide a MEMS switch having a large actuation headroom. The MEMS switch may be a teeter-totter MEMS switch having a relatively stiff beam, an anchor and relatively flexible hinges. Alternatively, the MEMS switch may be a cantilevered switch. The aspects of the present application relating to MEMS switches exhibiting a large actuation headroom are not limited in this respect. The beam of the switch may be sufficiently stiff to avoid bending during typical operation of the switch, while the hinges may be sufficiently flexible to allow for hinging (e.g., torquing) during typical operation of the switch. The MEMS switch is fabricated using MEMS fabrication techniques. FIG. 1A illustrates schematically a teeter-totter switch, according to a non-limiting embodiment of the present application, and which may exhibit a large actuation headroom in accordance with aspects of the present application. Teeter-totter switch 100 may comprise a beam 102, an anchor 104, and electrodes 111, 112, 121, 122, 123, 131 and 132. In some embodiments, beam 102 may comprise a conductive material, such as gold, nickel or any other suitable conductive material. The material may be selected to provide a desired level of stiffness, for example to avoid bending when subjected to voltages of the magnitude typically experienced during operation of the MEMS switch. In some embodiments, the beam may comprise a single material. In other embodiments, the beam may comprise a laminate consisting of successively stacked materials. Beam 102 may be positioned to form one or more contacts with anchor 104, which may be disposed on a substrate (not shown in FIG. 1A). For example, anchor 104 may be disposed on a substrate of a silicon wafer. However, the application is not limited in this respect and any other suitable type of substrate can be used. In some embodiments, anchor 104 may be disposed on a layer of silicon dioxide, which may be positioned on the substrate. In some embodiments, beam 102 may be held solely by anchor 104, and may be suspended over the substrate. Electrodes 131 and 132 may be formed on either end of beam 102, for example being positioned near opposite edges of beam 102, with the remaining electrodes being on the substrate. Electrode 123 may be in electrical contact with anchor 104 and beam 102.

Figure 1B:
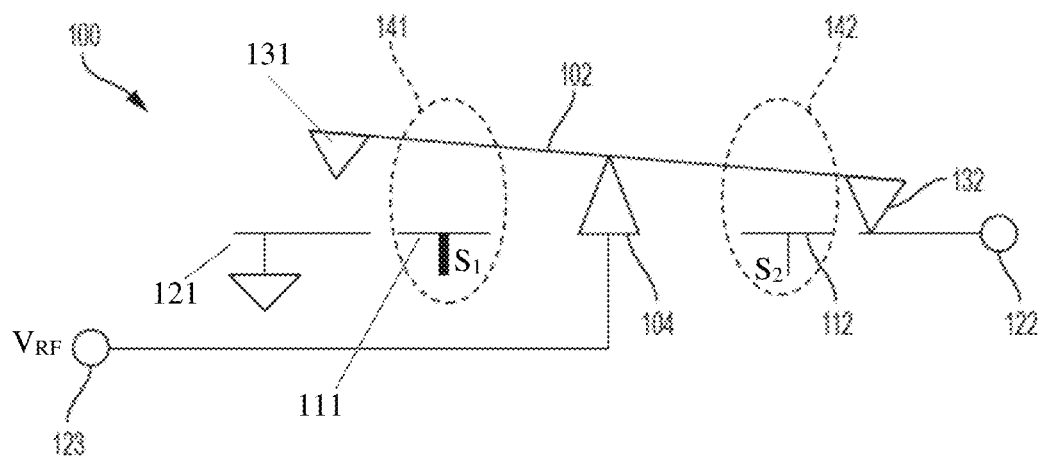
FIG. 1B illustrates schematically the MEMS switch of FIG. 1A in a closed state.
Figure 1C:
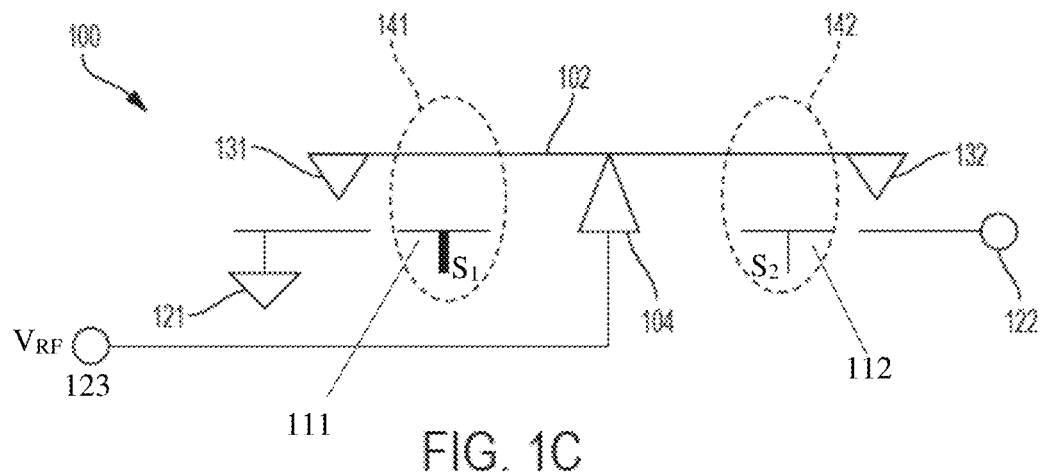
FIG. 1C illustrates schematically the MEMS switch of FIG. 1C in a neutral state.

Teeter-totter switch 100 will be referred to herein as being in an "open state" when electrode 131 forms an electrical connection with electrode 121, as shown in FIG. 1A. In some embodiments, electrode 121 may be connected to a reference potential, such as an earth ground. Teeter-totter switch 100 will be referred to herein as being in a "closed state" when electrode 132 forms an electrical connection with electrode 122, as shown in FIG. 1B. In some embodiments, electrode 122 may be connected to a device and/or a circuit element. Due to the fact that beam 102 may comprise a conductive material, electrode 131 and electrode 132 may be biased at the same electrical potential in some embodiments. In other embodiments, there may be a voltage drop between electrode 131 and electrode 132 due to the finite conductivity of beam 102. Teeter-totter switch 100 will be referred to herein as being in an "neutral state" when electrode 131 does not form an electrical connection with electrode 121 and electrode 132 does not form an electrical connection with electrode 122, as shown in FIG. 1C.

In some embodiments, electrodes 111 and 112 may be used to control whether the teeter-totter MEMS switch is in an open, closed or neutral state. Electrode 111 may be configured to operate as a terminal of a first capacitor (e.g., a so-called "back-capacitor") 141. The second terminal of first capacitor 141 may be formed by a portion of beam 102. Similarly, electrode 112 may be configured to operate as a terminal of a second capacitor (e.g., a so-called "front-capacitor") 142. The second terminal of second capacitor 142 may be formed by a portion of beam 102. Beam 102 may be biased at a voltage via application of a signal to electrode 123, whether direct current (DC) or alternating current (AC), having an average value that is within a suitable range, such as, for example, between −0.1V and 0.1V in some embodiments, between −0.25V and 0.25V in some embodiments, between −0.5V and 0.5V in some embodiments, between −1V and 1V in some embodiments, between −2V and 2V in some embodiments, between −5V and 5V in some embodiments, between −10V and 10V in some embodiments, or between any values or range of values within such ranges. Other ranges are also possible. In some embodiments, beam 102 may be biased through an AC signal applied to electrode 123, having a voltage $V_{RF}$.

FIG. 1A illustrates schematically teeter-totter switch 100 operating in an open state, according to a non-limiting embodiment of the present application. In some embodiments, first capacitor 141 may be used to force teeter-totter switch 100 to an open state. In some embodiments, electrode 111 may be biased with a signal $S_1$ having a voltage that causes beam 102 to experience an electrostatic attraction toward electrode 111. For example, electrode 111 may be biased with signal $S_1$ at a voltage that is greater than 10V in some embodiments, greater than 25V in some embodiments, greater than 50V in some embodiments, greater than 75V in some embodiments, greater than 80V in some embodiments, greater than 100V in some embodiments, or between 10V and 100V, as non-limiting examples. The signal S1 may be a periodic signal, a pulse signal, an on-demand signal, or any other type of signal providing suitable timing. In response to applying such a voltage to bias electrode 111, beam 102 may tilt toward electrode 111 and, consequently, electrode 131 may form an electrical connection with electrode 121. In some embodiments, beam 102 may tilt by pivoting or hinging about anchor 104. In such a state, a signal applied to electrode 123 and having a voltage $V_{RF}$ may not be able to reach the device and/or circuit element connected to electrode 122. In some embodiments, second capacitor 142 may be biased with a signal $S_2$ having a voltage that is less than the voltage across the terminals of first capacitor 141 in the open state. For example, second capacitor 142 may be biased with signal $S_2$ at a voltage having an average value equal to zero in the open state. Thus, in the open state, the signal at electrode 140 does not pass through the switch to electrode 122.

FIG. 1B illustrates schematically teeter-totter switch 100 operating in a closed state, according to a non-limiting embodiment of the present application. In some embodiments, second capacitor 142 may be used to force teeter-totter switch 100 to a closed state. In some embodiments, electrode 112 may be biased with signal $S_2$ at a voltage that causes beam 102 to experience an electrostatic attraction toward electrode 112. For example, electrode 112 may be biased at any of the voltages described previously in connection with signal $S_1$ biasing electrode 111. In response to biasing electrode 112, beam 102 may tilt toward electrode 112 and, consequently, electrode 132 may form an electrical connection with electrode 122. In some embodiments, beam 102 may tilt by pivoting or hinging about anchor 104.

In such a state, a signal applied to electrode 123 and having a voltage $V_{RF}$ may propagate through anchor 104, beam 102, and electrode 132, thus reaching the device and/or circuit element connected to electrode 122. In some embodiments, first capacitor 141 may be biased with a voltage that is less than the voltage across the terminals of second capacitor 142 in the closed state. For example, first capacitor 141 may be biased with a voltage having an average value equal to zero in the closed state.

FIG. 1C illustrates schematically teeter-totter switch 100 operating in a neutral state, according to a non-limiting embodiment of the present application. By biasing first capacitor 141 and second capacitor 142 with equal voltages, beam 102 may remain in a position of equilibrium on anchor 104, such that electrode 131 does not form an electrical connection with electrode 121 and electrode 132 does not form an electrical connection with electrode 122.

As described above, the teeter-totter switch 100 is configured to have a large actuation headroom, meaning that the voltage which signals S1 and S2 need to assume to actuate the teeter-totter switch 100 is sufficiently greater than the voltage $V_{RF}$ of the signal being passed by the teeter-totter switch 100 to avoid inadvertent actuation of the teeter-totter switch 100 by the signal application to electrode 123. The hinges of the teeter-totter switch 100, not shown in FIGS. 1A-1C, are configured to prevent torqueing of the switch unless the voltage(s) applied to terminals 111 or 112 assumes a sufficient value, selected to be meaningfully greater than the likely value of $V_{RF}$. In some embodiments, the MEMS switches described herein are configured to require an actuation voltage between 1.5× and 100× greater than the expected voltage of the signal to be passed by the switch. In some embodiments, the MEMS switches described herein are configured to require an actuation voltage between 1.5× and 20× greater than the expected voltage of the signal to be passed by the switch, or between 3× and 10× greater than the expected voltage of the signal to be passed by the switch. In some embodiments, the MEMS switches described herein are configured to require an actuation voltage between 1.5× and 100× greater than the maximum voltage that can be sustained by the switch.

The MEMS switches described herein may exhibit a large actuation headroom due at least in part to suitable hinge design. The hinge(s) of the MEMS switch, and in particular the stiffness of the hinges, may impact, and in some cases may control, how much force must be applied to the beam of the switch to achieve actuation. According to some embodiments, the MEMS switches described herein may have a distributed hinge configuration. For instance, the MEMS switch may include a plurality of hinges, and the plurality of hinges may be configured to prevent closing of the MEMS switch if the actuation voltage is not at least twice as large as the maximum voltage of the signal applied to the beam of the MEMS switch.

Figure 2A:
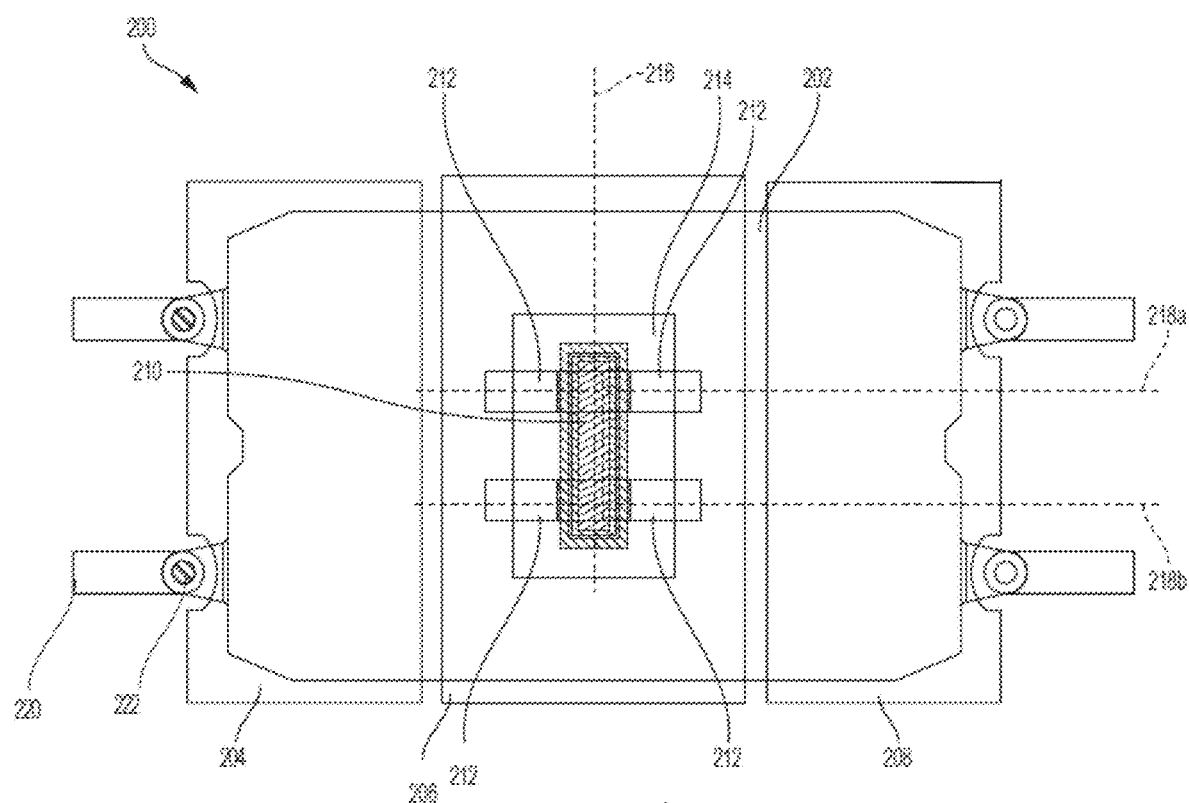
FIG. 2A is a top view of a teeter-totter MEMS switch having a distributed hinge configuration, according to a non-limiting embodiment of the present application.

FIG. 2A is a top schematic view of a teeter-totter MEMS switch 200 having a distributed hinge configuration, according to a non-limiting embodiment of the present application. The teeter-totter MEMS switch 200 comprise a beam 202, electrodes 204, 206, and 208, anchor 210, hinges 212, opening 214 in the beam 202, electrical contacts 220, and electrical contacts 222.

The beam 202 may have any suitable shape and be formed of any suitable material. The electrodes 204, 206, and 208 may be disposed on a substrate underlying the beam 202. For example, the electrodes 204, 206, and 208 may be disposed on a silicon substrate. Electrode 206 may be electrically connected to the anchor 210 to provide a signal thereto. The electrical signal may be a radiofrequency (RF) signal, or any other suitable signal. The electrodes 204 and 208 may apply voltages to actuate the beam 202. In that sense, the electrodes 204 and 208 may be like electrodes 111 and 112 of FIG. 1A. The anchor 210 may be a post or other suitable structure. In at least some embodiments, the anchor 210 extends from the underlying substrate to suspend the beam 202 above the substrate. The anchor 210 is shown as having a rectangular shape, but other shapes are possible.

The hinge configuration of teeter-totter MEMS switch 200 is a distributed hinge. Specifically, in this non-limiting embodiment four hinges 212 are provided, connecting the beam 202 to the anchor 210. The hinges 212 may be formed of the same material as beam 202. For example, the opening 214 may be etched from the beam 202, defining the four hinges 212. In the illustrated embodiment, the four hinges 212 include two hinges on opposite sides of the anchor 210. The inclusion of multiple hinges on the two sides, as opposed to a single hinge on the two sides of the anchor 110, provides beneficial characteristics in terms of desired stiffness and robustness. For example, having two hinges 212 to the left of axis 216 as opposed to a single hinge, may provide additional stiffness which requires application of a larger actuation voltage to electrode 204 and/or electrode 208 to actuate the switch 200 than if a single instance of the same hinge 212 were included on the left side of axis 216. The same is true of the two hinges 212 on the right side of axis 216. In this non-limiting example, the MEMS switch includes two hinges 212 along axis 218a and two hinges 212 along axis 218b.

The teeter-totter MEMS switch 200 includes electrical contacts 220 and 222. Electrical contacts 220 may be on the underlying silicon substrate, and may operate in the manner described previously in connection with electrodes 121 and 122. The electrical contacts 220 may be attached to the beam 202, and may operate in the manner described previously in connection with electrodes 131 and 132. Thus, in some embodiments, the MEMS switch beam includes electrodes or other electrical contacts configured to contact an electrode or contact pad on the silicon substrate when the MEMS switch is closed.

Figure 2B:
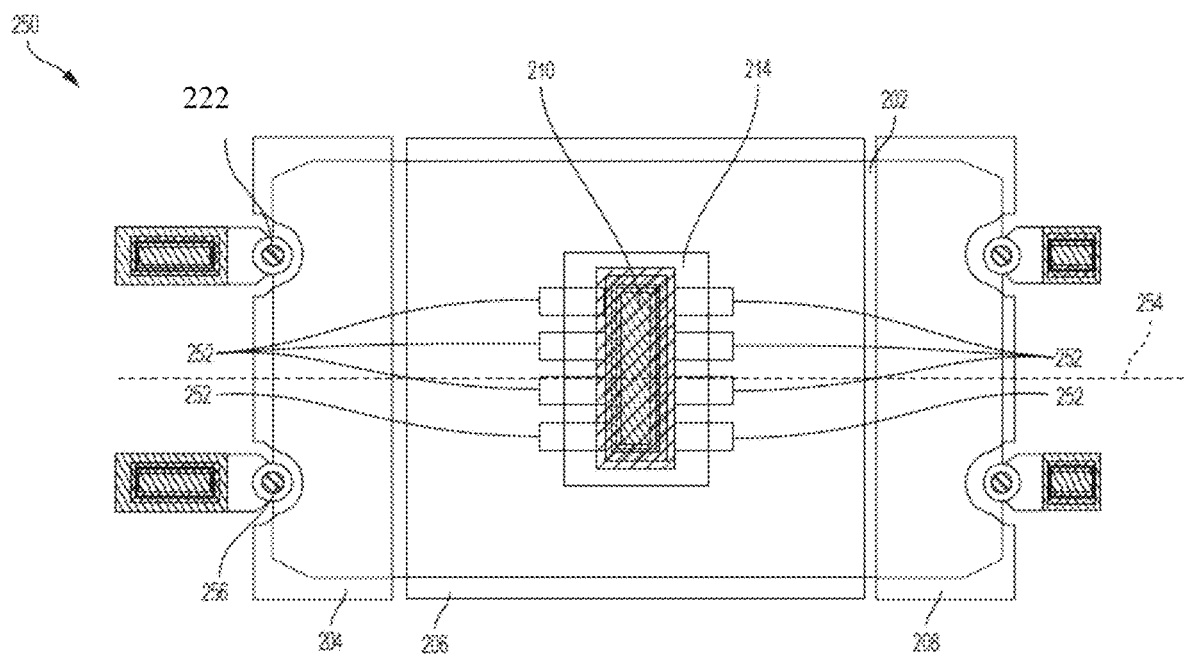
FIG. 2B is a top view of an alternative teeter-totter MEMS switch having a distributed hinge configuration, according to another non-limiting embodiment of the present application.

FIG. 2B is a top schematic view of an alternative teeter-totter MEMS switch 250 having a distributed hinge configuration, according to another non-limiting embodiment of the present application. The teeter-totter MEMS switch 250 is substantially the same as teeter-totter MEMS switch 200 except that the distributed hinge configuration comprises four hinges 252 on each side of the anchor 210, for a total of eight hinges 252. Including additional hinges may provide increased stiffness, and therefore increase the voltage required to actuate the teeter-totter MEMS switch. Although FIGS. 2A and 2B illustrate configurations of distributed hinges having four and eight hinges, respectively, other numbers of hinges may be implemented.

The hinges of the MEMS switch may be oriented appropriately to provide desired pivoting of the beam. As can be seen in FIG. 2B, the illustrated hinges are arranged parallel to the length (in the left-right direction of FIG. 2B) of the beam 202. In this embodiment, there are no hinges that connect the beam 202 to the anchor 210 and that are perpendicular to the length of the beam 202. Thus, it should be appreciated that in some embodiments of the present disclosure a MEMS switch with a distributed hinge includes a beam, an anchor, and hinges connecting the beam to the anchor, where the hinges are only parallel to the beam and not perpendicular to the beam. The hinges may be in-plane with the beam.

Figure 3:
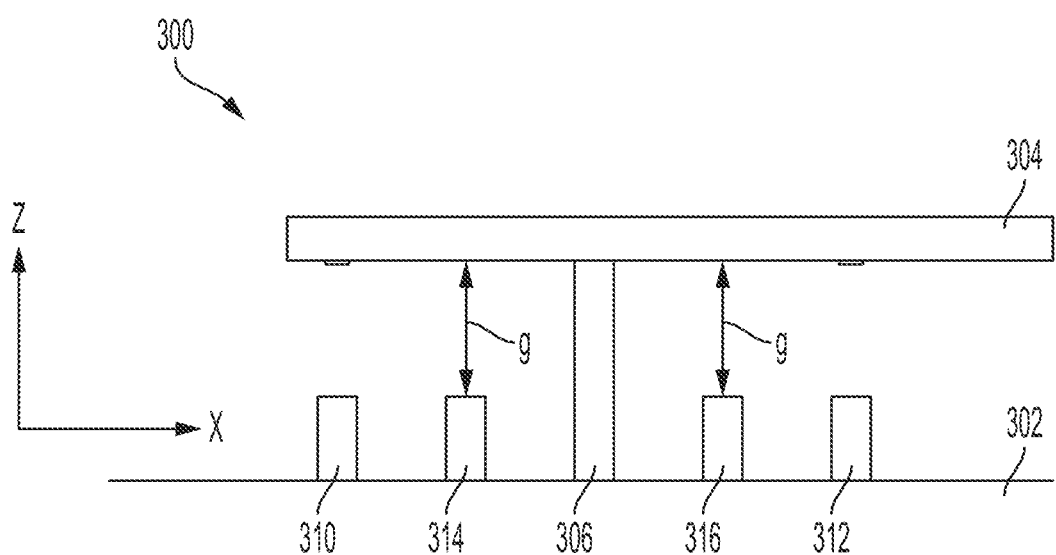
FIG. 3 illustrates a side view of a teeter-totter MEMS switch according to a non-limiting embodiment of the present application.

Another factor impacting the voltage required to actuate a MEMS switch is the distance between the beam and the electrodes to which the actuation voltage is applied. The greater the distance, the larger the voltage that needs to be applied to actuate the switch, and the smaller the distance the lower the voltage that can be used to achieve actuation. Referring to FIG. 3, a side view of a teeter-totter MEMS switch 300 is illustrated. The teeter-totter MEMS switch 300 comprises a substrate 302 (e.g., a silicon substrate), a beam 304, an anchor 306, and electrodes 310, 312, 314, and 316. The electrodes 310 and 312 are positioned to contact the beam 304 when the beam 304 is tilted in their respective directions. The electrodes 314 and 316 are configured to receive actuation signals to actuate the beam 304. The electrodes 314 and 316 are separated from the beam 302 by a distance g. The value of g impacts the voltage of the signal that needs to be applied to electrode 314 and/or electrode 316 to achieve actuation.

Thus, aspects of the present application which provide a MEMS switch exhibiting a large actuation headroom include a hinge configuration and gap distance between the MEMS beam and the underlying substrate selected such that the actuation voltage needed to actuate the MEMS switch is sufficiently larger than the expected—and in some embodiments the maximum—voltage of the signal to be passed by the MEMS switch as to avoid inadvertent actuation of the MEMS switch.

Some aspects of the present application provide a method of operating a MEMS switch having a large actuation headroom. The MEMS switch is closed by applying an actuation voltage that is at least twice as large as the magnitude of a signal to be passed through a beam of the MEMS switch. To keep the MEMS switch closed, the actuation voltage may be maintained at a value at least twice as large as the magnitude of the signal to be passed through the beam. The method may include opening by the MEMS switch by reducing the actuation voltage to a value that is less than twice as great as the voltage signal to be passed through the beam.

Figure 4:
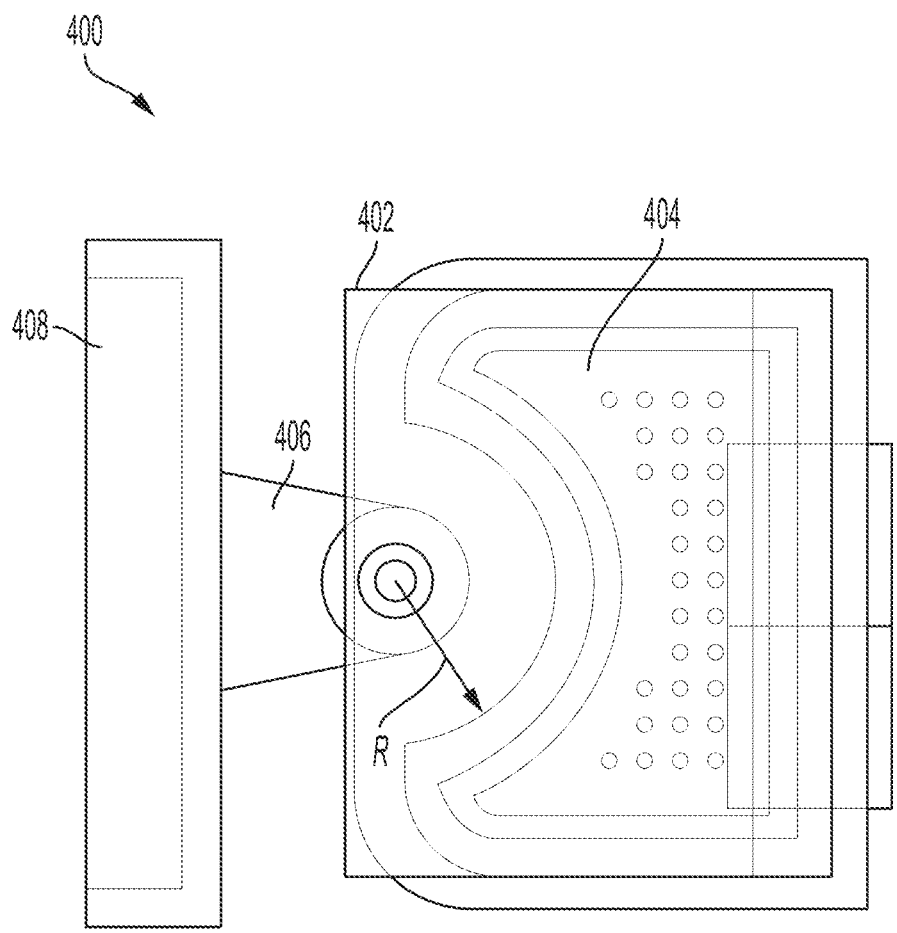
FIG. 4 is a top view of a radially symmetric electrical contact configuration which may be employed with MEMS switches of the types described herein, according to a non-limiting embodiment of the present application.

Aspects of the present application provide MEMS switches configured to make electrical contact with contact pads on an underlying substrate. In some embodiments, the electrical contacts may be radially symmetric, which may facilitate supporting higher current densities and higher voltage RF signals. FIG. 4 illustrates a non-limiting example.

FIG. 4 is a top view of an electrical contact configuration as may be used with MEMS switches of the types described herein. The electrical contact configuration 400 comprises an electrical contact pad 402 which may be disposed on a substrate, and a radially symmetric thick metallization 404 on the contact pad 402. The radially symmetric thick metallization 404 has a semi-circular contour with radius R, which may assume any suitable value. The contact 402 and thick metallization 404 may be formed of any suitable conductive materials. Providing the thick metallization 404 with the radially symmetric contour facing the electrode 406 on beam 408 enables the handling of higher electrical current densities than other contact configurations, and supports the transfer of higher voltage RF signals.

The radially symmetric thick metallization may have a suitable thickness to provide the desired electrical behavior. In some embodiments, the thick metallization has a thickness between 50 microns and 200 microns. In some embodiments, the thick metallization has a thickness between 100 microns 300 microns. Any value within those ranges may be used.

The beam of the MEMS switch may include a contact electrode configured to contact the contact pad on the substrate at a suitable location. For example, when the radially symmetric thick metallization has a semi-circular contour, the beam may comprise a contact electrode configured to contact the contact pad on the substrate at a location representing a center of the semi-circular contour.

The radius of the semi-circular contour may assume any suitable value for providing the desired electrical behavior. In some embodiments, the center of the semi-circular contour is between 1 micron and 5 microns from the semi-circular contour. That is, the radius of the semi-circular contour may be between 1 and 5 microns.

The MEMS switches described herein may be used in various applications. For example, they may be used in high power applications, such as control circuits for industrial equipment. They may be used in medical equipment for high voltage switching. Other applications are also possible.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) switch, comprising:
    a substrate;
    an anchor coupled to the substrate;
    a beam coupled to the anchor by a plurality of hinges and suspended above the substrate; and
    a plurality of electrodes disposed on the substrate and including a first electrode configured to receive an actuation voltage and a second electrode configured to apply a signal to the beam, the actuation voltage being greater than a maximum voltage of the signal applied to the beam.

2. The MEMS switch of claim 1, wherein the second electrode is configured to apply a radiofrequency signal to the beam.

3. The MEMS switch of claim 1, wherein the plurality of hinges are configured to prevent closing of the MEMS switch when the actuation voltage is not at least twice as large as the maximum voltage of the signal applied to the beam.

4. The MEMS switch of claim 1, wherein the beam comprises a contact electrode configured to contact the second electrode when the MEMS switch is closed.

5. The MEMS switch of claim 1 wherein the plurality of hinges comprises multiple hinges coupled to a same side of the anchor.

6. The MEMS switch of claim 5, wherein the plurality of hinges comprises four hinges coupled to the same side of the anchor.

7. The MEMS switch of claim 6, wherein the plurality of hinges are in-plane with and parallel to a length of the beam.

8. The MEMS switch of claim 7, wherein the MEMS switch does not include any hinges perpendicular to the beam.

9. A method of operating a microelectromechanical systems (MEMS) switch, comprising:
    applying a signal to a beam of the MEMS switch; and
    applying an actuation voltage to a first electrode on a substrate underlying the beam of the MEMS switch, wherein the actuation voltage is at least twice as large as a maximum voltage of the signal applied to the beam.

10. The method of claim 9, wherein applying the actuation voltage to the first electrode comprises applying a voltage at least three times greater than the maximum voltage of the signal applied to the beam.

11. The method of claim 9, wherein applying the actuation voltage to the first electrode comprises applying a voltage between two and ten times greater than the maximum voltage of the signal applied to the beam.

12. The method of claim 9, wherein applying the actuation voltage to the first electrode comprises maintaining the actuation voltage at a value at least twice as large as a maximum voltage of the signal applied to the beam while the MEMS switch is closed.

13. The method of claim 9, further comprising opening the MEMS switch by reducing the actuation voltage to a value less than twice as large as the maximum voltage of the signal applied to the beam.

14. A microelectromechanical systems (MEMS) teeter-totter switch, comprising:
   a substrate;
   an anchor;
   a beam suspended above the substrate, coupled to the anchor and configured to pivot about the anchor, wherein the anchor comprises four or more substantially parallel tethers attached to the beam;
   a contact pad on the substrate;
   a radially symmetric metallization on the contact pad; and
   a plurality of electrodes disposed on the substrate and including a first electrode configured to receive an actuation voltage and a second electrode configured to apply a signal to the beam, the actuation voltage being greater than a maximum voltage of the signal applied to the beam.

15. The MEMS teeter-totter switch of claim 14, wherein the four or more tethers comprises two tethers on either side of the anchor.

16. The MEMS teeter-totter switch of claim 14, wherein the four or more tethers comprises four tethers on a same side of the anchor.

17. The MEMS teeter-totter switch of claim 14, wherein the radially symmetric metallization has a thickness between 50 microns and 200 microns.

18. The MEMS teeter-totter switch of claim 17, wherein the radially symmetric metallization has a semi-circular contour.

19. The MEMS teeter-totter switch of claim 18, wherein the beam comprises a contact electrode configured to contact the contact pad on the substrate at a location representing a center of the semi-circular contour.

20. The MEMS teeter-totter switch of claim 19, wherein the center of the semi-circular contour is between 1 micron and 5 microns from the semi-circular contour.

* * * * *